(12) United States Patent
Hurwitz et al.

(10) Patent No.: US 10,587,233 B2
(45) Date of Patent: *Mar. 10, 2020

(54) HIGH POWER RF SWITCHES USING MULTIPLE OPTIMIZED TRANSISTORS AND METHODS FOR FABRICATING SAME

(71) Applicant: Newport Fab, LLC, Newport Beach, CA (US)

(72) Inventors: Paul D. Hurwitz, Irvine, CA (US); Roda Kanawati, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/025,996

(22) Filed: Jul. 2, 2018

(65) Prior Publication Data

US 2018/0323757 A1    Nov. 8, 2018

Related U.S. Application Data

(62) Division of application No. 15/175,982, filed on Jun. 7, 2016, now Pat. No. 10,044,331.

(Continued)

(51) Int. Cl.
*H03F 3/24* (2006.01)
*H01L 27/12* (2006.01)
(Continued)

(52) U.S. Cl.
CPC .............. *H03F 3/245* (2013.01); *H01L 21/84* (2013.01); *H01L 27/1203* (2013.01);
(Continued)

(58) Field of Classification Search
CPC ........... H01L 29/78621; H01L 29/7833; H01L 21/84; H01L 21/823412; H03F 3/245
See application file for complete search history.

(56) References Cited

U.S. PATENT DOCUMENTS 10,044,331 B2 *   8/2018  Hurwitz .............. H01L 27/1203
2009/0057779 A1 *  3/2009  Jang ................ H01L 21/823412
                                                      257/392

(Continued)

*Primary Examiner* — Quoc D Hoang
(74) *Attorney, Agent, or Firm* — Bever, Hoffman & Harms, LLP (57) ABSTRACT

An RF switch includes series-connected transistors having different threshold voltages, breakdown voltages and on-resistances, without relying on different channel lengths to provide these differences. A first set of transistors located near a power amplifier output are fabricated to have first channel regions with relatively high dopant concentrations. A second set of transistors located near an antenna input, are fabricated to have second channel regions with relatively low dopant concentrations. The first set of transistors can also include halo implants to increase the dopant concentrations in the first channel regions. Lightly doped drain (LDD) regions of the first set of transistors can have a lower dopant concentration (and be shallower) than LDD regions of the second set of transistors. Transistors in the first set have a relatively high on-resistance, a relatively high breakdown voltage and a relatively high threshold voltage, when compared with transistors in the second set.

12 Claims, 8 Drawing Sheets

Related U.S. Application Data (60) Provisional application No. 62/173,289, filed on Jun. 9, 2015.

(51) Int. Cl.
*H01L 21/84* (2006.01)
*H01L 29/78* (2006.01)
*H01L 29/10* (2006.01)
*H03K 17/10* (2006.01)
*H01L 29/786* (2006.01)
*H01L 21/265* (2006.01)
*H01L 21/8234* (2006.01)

(52) U.S. Cl.
CPC ...... *H01L 27/1251* (2013.01); *H01L 29/1045* (2013.01); *H01L 29/7833* (2013.01); *H01L 29/78621* (2013.01); *H03K 17/102* (2013.01); *H01L 21/26586* (2013.01); *H01L 21/823412* (2013.01); *H01L 21/823418* (2013.01); *H03F 2200/421* (2013.01); *H03F 2200/451* (2013.01)

(56) References Cited

U.S. PATENT DOCUMENTS

2013/0334608 A1* 12/2013 Ikoma ............. H01L 21/823412
257/368
2014/0110783 A1* 4/2014 Zhang ............. H01L 21/823814
257/344
2014/0183630 A1* 7/2014 Hao ................ H01L 21/823412
257/337

* cited by examiner

HIGH POWER RF SWITCHES USING MULTIPLE OPTIMIZED TRANSISTORS AND METHODS FOR FABRICATING SAME

RELATED APPLICATION

The present application is a divisional of commonly owned U.S. patent application Ser. No. 15/175,982, filed Jun. 7, 2016 and entitled "HIGH POWER RF SWITCHED USING MULTIPLE OPTIMIZED TRANSISTORS", which claims priority to U.S. Provisional Application Ser. No. 62/173,289, filed Jun. 9, 2015, which is incorporated herein by reference.

FIELD OF THE INVENTION

The present invention relates to a semiconductor structure, such as a radio frequency (RF) switch that includes a plurality of interconnected field effect transistors having similar channel lengths, but different on-resistances, breakdown voltages and/or threshold voltages.

RELATED ART

Stacked transistors for RF ("radio frequency") switches are used in, for example, cellular front end modules and other wireless devices. When switching RF power in a cellular telephone, changes in impedance of the antenna, for example, due to a user touching the antenna, can result in large current and voltage swings in the RF switch branches that receive a power amplifier output to drive the antenna.

Figure 1:
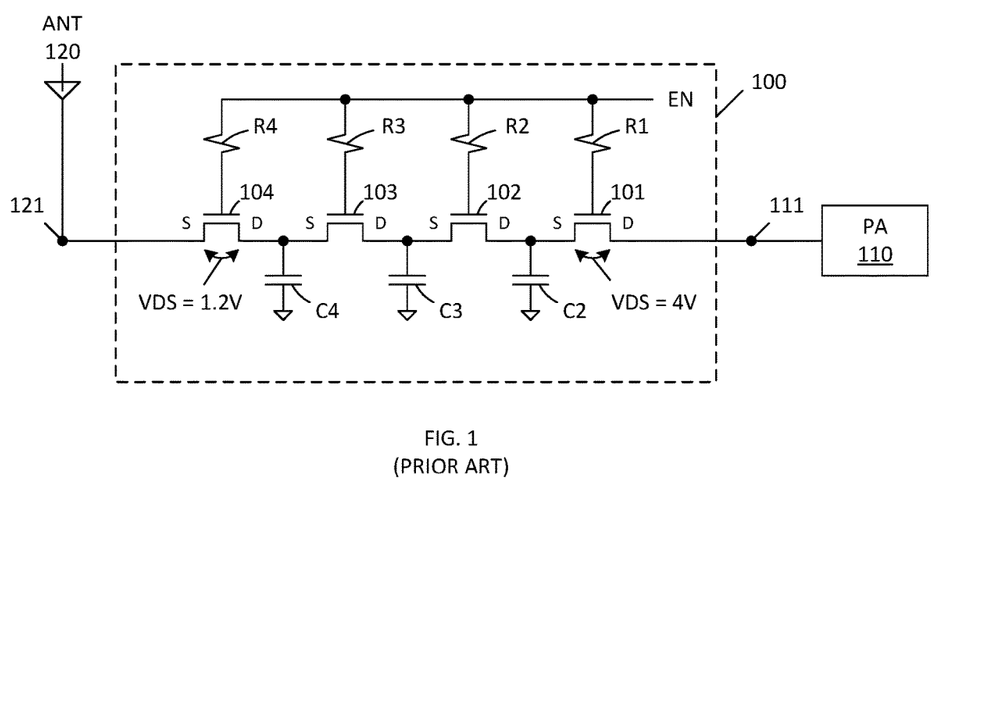
FIG. 1 is a circuit diagram of a conventional RF switch branch.

FIG. 1 is a circuit diagram of an RF switch branch 100 that includes four exemplary n-channel field effect transistors 101-104 connected in cascade (i.e., in series). The gates of transistors 101, 102, 103 and 104 are coupled to receive a switch enable signal (EN) via corresponding resistors R1, R2, R3 and R4, as illustrated. Although 12 to 30 or more transistors are typically connected in series to form an RF switch branch 100, only four transistors are shown in FIG. 1 to provide a simple example. A power amplifier 110 drives the switch branch 100 of the four stacked transistors 101-104 at power amplifier output node 111, while an antenna 120 receives the signals transmitted through the switch branch at antenna input node 121. Typically, the stacked transistors 101-104 in the RF switch branch 100 support an operating voltage of about 40 to 70 volts. That is, a voltage differential of about 40 to 70 Volts is developed across the power amplifier output 111 and the antenna input 121 during normal operation of the RF switch branch 100.

As known in the art, to support a higher voltage swing between power amplifier output 111 and antenna input 121, a larger number of transistors can be stacked in the RF switch branch 100. However, as more transistors are stacked in the RF switch branch 100, the resistance between the power amplifier output 111 and the antenna input 121 increases, thereby resulting in an undesirable increase in "insertion loss" in the RF switch branch 100.

Figure 2:
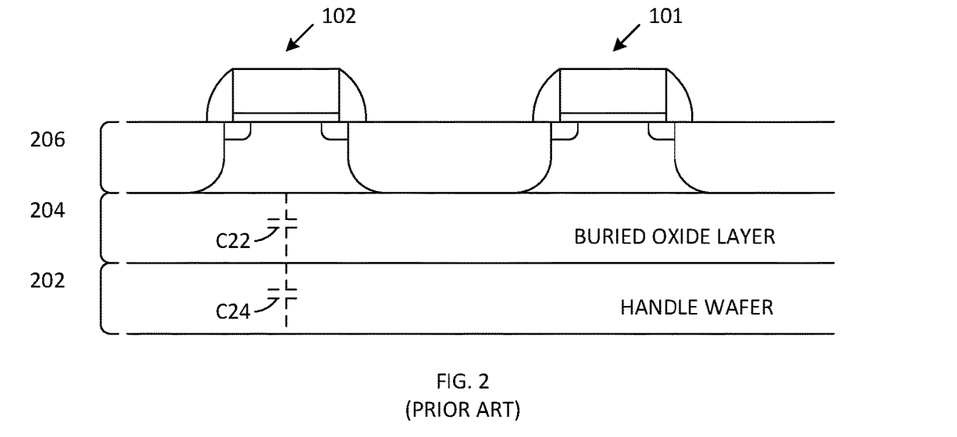
FIG. 2 is a cross-sectional diagram illustrating two of the transistors of the conventional RF switch branch of FIG. 1.

As illustrated by FIG. 1, parasitic capacitances C2, C3 and C4 exist between the source/drain nodes of transistors 101-104 and ground. FIG. 2 is a cross sectional view of exemplary silicon-on-insulator (SOI) transistors 101 and 102 of RF switch branch 100. Identical transistors 101 and 102 are fabricated in a silicon layer 206 in a manner known in the art. Silicon layer 206 is located on buried oxide (BOX) layer 204, which in turn, is located on handle wafer 202. During normal operation of the RF switch branch 100, handle wafer 202 is grounded or provides the lowest impedance path to circuit ground. FIG. 2 illustrates series-connected capacitors C22 and C24, which are situated respectively in the buried oxide layer 204 and the handle wafer 202 in the SOI (silicon-on-insulator) structure. Capacitors C22 and C34 give rise to the parasitic capacitances C2, C3 and C4 of FIG. 1. The combined effect of the parasitic capacitances C2, C3 and C4 in the RF switch branch 100 is that the voltages across the transistors 101-104 are not uniformly distributed. In fact, transistor 101 will experience a larger VDS (drain to source voltage) than transistor 104 during the normal operation of RF switch branch 100. For example, transistor 101 may exhibit a VDS of about 4.0 Volts, while transistor 104 may exhibit a VDS of about 1.2 Volts.

In the design of the RF switch branch 100, each of the identical transistors 101-104 must be capable of sustaining the highest possible VDS voltage (in the present example, about 4.0 Volts), even though many of the transistors in the RF switch branch 100 will experience a much lower VDS voltage. Using transistors with the highest possible VDS voltage therefore results in undesirable "over-engineering". Moreover, transistors capable of handling higher VDS voltages will exhibit higher on-resistances, thereby resulting in an increased resistance of the RF switch branch 100 (and increased insertion loss).

One known approach to overcome the above-described deficiencies of RF switch branch 100 is to increase the channel length of transistors in the high side of the stack (i.e., near the power amplifier output node 111) to support higher VDS voltages, and reduce the channel length of transistors in the low side of the stack (i.e., near the antenna input node 121) to support lower VDS voltages. However, the characteristics of the transistor do not change linearly as the channel length of the transistor is reduced. For example, the tradeoff between the transistor VDS voltage and the transistor on-resistance is non-linear. Gate-induced drain leakage current (GIDL) can also limit voltage handling capability and this limitation is not increased with longer channel length. Thus, the behavior of the transistors is not easily controlled by adjusting the channel length of the transistors.

It would therefore be desirable to have an improved RF switch branch which overcomes the above-described deficiencies.

SUMMARY

Accordingly, the present invention provides improved methods for providing transistors in an RF switch branch with different threshold voltages, breakdown voltages and on-resistances, without relying only on different channel lengths to provide these differences. In one embodiment, a first set of transistors of the RF switch branch, which are located near a power amplifier output terminal, are fabricated to have channel regions with a relatively high dopant concentration, and a second set of transistors of the RF switch branch, which are located near an antenna input node, are fabricated to have channel regions with a relatively low dopant concentration. The transistors in the first and second sets have similar channel lengths. Under these conditions, transistors in the first set have a relatively high on-resistance, a relatively high breakdown voltage and a relatively high threshold voltage, when compared with transistors in the second set.

In one embodiment, the channel regions of the first and second sets of transistors can be doped before the formation of the transistor gate electrodes. In an alternate embodiment, the channel regions of the first set of transistors are subjected to a halo implant after the formation of the transistor gate electrodes, wherein the halo implant increases the dopant concentration in the channel regions of the transistors in the first set.

In another embodiment, the first set of transistors are fabricated using a lightly doped drain (LDD) implant process having a relatively low dosage and a relatively high implant energy (thereby forming relatively deep LDD regions having relatively low dopant concentrations), and the second set of transistors are fabricated using a LDD implant process having a relatively high dosage and a relatively low implant energy (thereby forming relatively shallow LDD regions having relatively high dopant concentrations). Under these conditions, transistors in the first set have a relatively high on-resistance, a relatively high power handling capability (owing to lower GIDL current) and a relatively high threshold voltage, when compared with transistors in the second set.

Various combinations of the above-described embodiments can be used to fabricate the first and second sets of transistors.

The present invention will be more fully understood in view of the following description and drawings.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present inventive concepts resolve problems in the art by creating a high power/high resistance transistor, and a low power/low resistance transistor in the same semiconductor processing platform for use in, for example, an RF switch branch that benefits from the use of transistors of both types (i.e., both high power (high VDS breakdown) transistors and low power (low VDS breakdown) transistors. Each type of transistor has some adjustability to better control the need for higher VDS breakdown voltage transistors at the high end of the RF switch stack and lower VDS breakdown voltage transistors at the low end of the RF switch stack. This is accomplished by, for example, a unique technique for customizing the body implants for the different transistor types so that the higher power transistors receive a higher body doping and achieve a higher threshold voltage, while the lower power transistors receive a lower body doping and achieve a lower threshold voltage.

Figure 3:
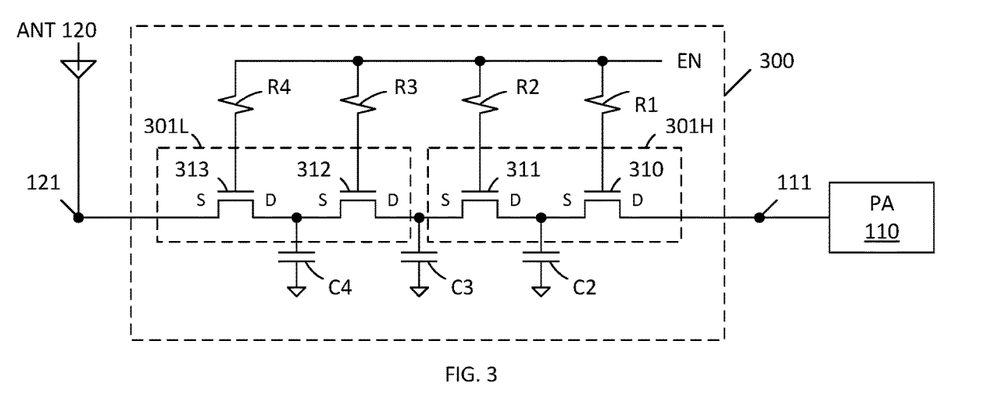
FIG. 3 is a circuit diagram including a power amplifier, an antenna and an RF switch branch in accordance with one embodiment of the present invention.

FIG. 3 is a circuit diagram including a power amplifier 110, an antenna 120 and an RF switch branch 300 in accordance with one embodiment of the present invention. Power amplifier 110 and antenna 120 are conventional elements that have been described above in connection with FIG. 1. RF switch branch 300 includes a first set of field effect transistors 301H and a second set of field effect transistors 301L, which are connected in series between the power amplifier output node 111 and the antenna input node 121. The first set of transistors 301H include individual transistors 310 and 311, which are located nearer to power amplifier output node 111 than antenna input node 121 (i.e., nearer to the high end of the RF switch branch 300). The second set of transistors 301L include individual transistors 312 and 313, which are located nearer to antenna input node 121 than power amplifier output node 111 (i.e., nearer to the low end of the RF switch branch 300). Although the first set of transistors 301H includes two transistors 310-311, and the second set of transistors 301L includes two transistors 312-313 in the described examples, it is understood that the first set of transistors 301H and the second set of transistors 301L may include other numbers of transistors in other embodiments. For example, the first set of transistors 301H and the second set of transistors 301L may each include X transistors, wherein X>2. In another embodiment, the first set of transistors 301H may include Y transistors, and the second set of transistors 301L may include Z transistors, wherein Y is not equal to Z.

In addition to transistors 310-314, RF switch branch 300 includes resistors R1-R4 and parasitic capacitances C2-C4, which have been described above in connection with FIG. 1.

As described in more detail below, transistors 311-314 have substantially identical channel lengths, transistors 310-311 include doped regions that cause these transistors to exhibit relatively high on-resistances, high breakdown voltages and high threshold voltages, and transistors 312-313 include one or more doped regions that cause these transistors to exhibit relatively low on-resistances, low breakdown voltages and low threshold voltages. This design advantageously allows the first set of transistors 301H to exhibit characteristics compatible with operating conditions present at the high end of the RF switch branch 300, and allows the second set of transistors 301L to exhibit characteristics compatible with operating conditions present at the low end of the RF switch branch 300.

The fabrication of the first set of transistors 301H and the second set of transistors 310L will now be described in more detail. In the examples provided below, transistor 311 represents each of the transistors included in the first set of transistors 301H, and transistor 312 represents each of the transistors included in the second set of transistors 301L.

FIGS. 4A-4E are cross sectional views of the high end transistor 311 and the low end transistor 312 during various phases of fabrication in accordance with various embodiments of the present invention. High end transistor 311 is fabricated in region $401_H$, and low end transistor 312 is fabricated in region $401_L$. In the described examples, transistors 311-312 are silicon on insulator (SOI) transistors.

Figure 4A:
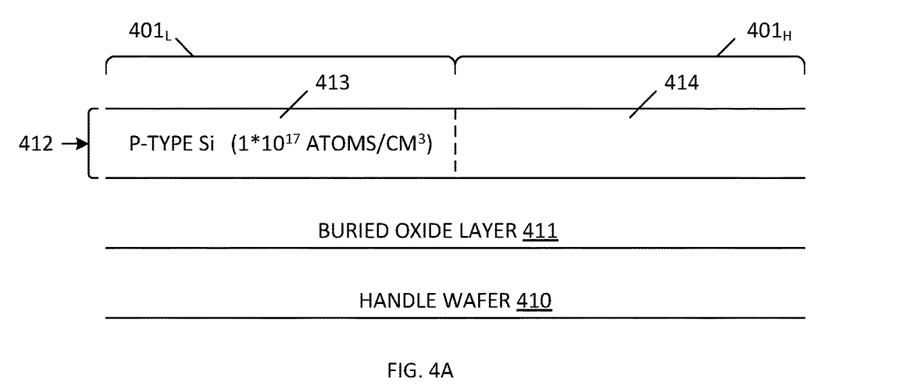
FIGS. 4A, 4B, 4C, 4D and 4E are cross-sectional views of a high end transistor and a low end transistor of the RF switch of FIG. 3 during various phases of fabrication in accordance with one embodiment of the present invention.

FIG. 4A illustrates a silicon layer 412 in which the transistors 311-312 are fabricated. Silicon layer 412 is located on a buried oxide (BOX) layer 411, which in turn, is located on a handle wafer 410. Silicon layer 412 and BOX layer 411 can be formed in various manners known to those of ordinary skill. In the described embodiment, transistors 311-312 are n-channel transistors. The body region 413 of low end transistor 312 is doped, for example, to a concentration of about $1.0*10^{17}$ atoms per cm$^3$, using a P-type dopant such as Boron. This doping of body region 413 can be accomplished in various manners. For example, the doping of body region 413 can be established during the formation of silicon layer 412 (e.g., during epitaxial growth of silicon layer 412). In this embodiment, both the body region 413 of low end transistor 312 and the body region 414 of high end transistor 311 initially have the same body dopant concentration (about $1.0*10^{17}$ atoms per cm$^3$).

In another embodiment, a body doping implant is performed, wherein a P-type dopant is implanted into body region 413 through an implant mask. Such an implant mask may expose both of regions $401_L$ and $401_H$, such that the body region 413 of low end transistor 312 and the body region 414 of high end transistor 311 initially have the same body dopant concentration (about $1.0*10^{17}$ atoms per cm$^3$).

In yet another embodiment, the implant mask exposes region 401L, but covers region 401H, such that body region 413 of low end transistor 312 is doped to the specified dopant concentration (about $1.0*10^{17}$ atoms per cm$^3$), and body region 414 of high end transistor 311 is not doped by the initial body implant.

Figure 4B:
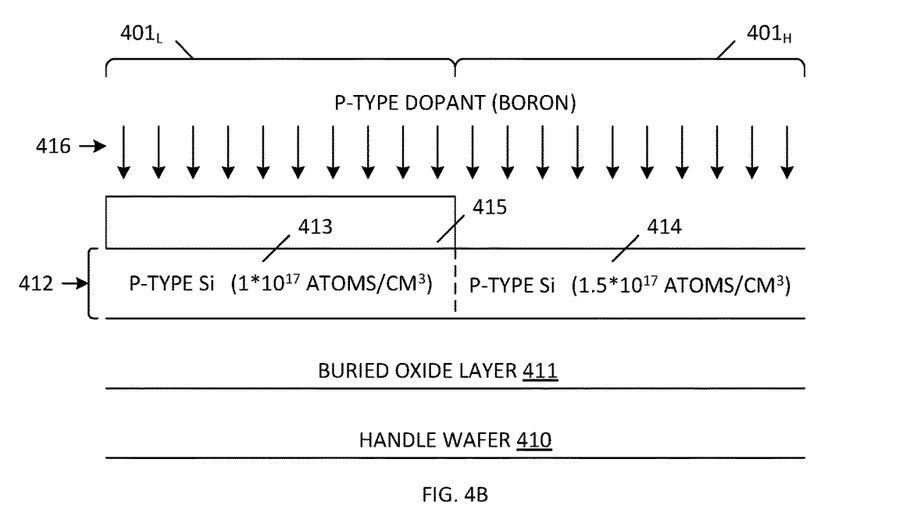

As illustrated by FIG. 4B, an implant 416 is performed such that the body region 414 of high end transistor 311 is doped, for example to a concentration of about $1.5*10^{17}$ atoms per cm$^3$, using a P-type dopant such as Boron. The dopant concentration of body region 414 is higher than the dopant concentration of body region 413, thereby causing the resulting high end transistor 311 (which is fabricated in body region 414) to have a higher on-resistance, higher breakdown voltage, and higher threshold voltage than the resulting low end transistor 312 (which is fabricated in body region 413). In the illustrated embodiment, an implant mask 415 is formed over silicon layer 412, wherein the implant mask 415 covers region $401_L$ and exposes region $401_H$. The dosage and energy of the implant is selected to cause the body region 414 to exhibit the desired dopant concentration (of about $1.5*10^{17}$ atoms per cm$^3$). Note that these parameters will be dependent on the previous (initial) dopant concentration of body region 414.

Figure 4C:
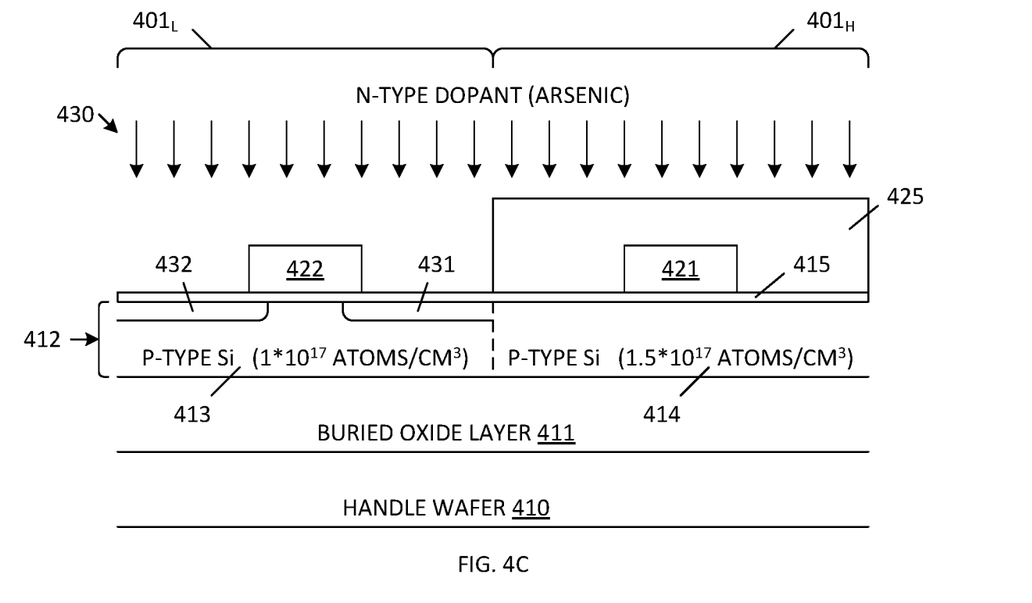

As illustrated by FIG. 4C, implant mask 415 is stripped, and a gate dielectric layer 420 is formed over the upper surface of silicon layer 412. In one embodiment, gate dielectric layer is silicon oxide having a thickness of about 50 Angstroms. Other gate dielectric materials and thicknesses can be used in other embodiments. Polysilicon gate electrodes 421 and 422 (of transistors 311 and 312, respectively) are formed over gate dielectric layer 420. A first lightly doped drain (LDD) implant mask 425 is formed over region 401H, wherein an opening in LDD implant mask 425 exposes region 401L. An N-type LDD implant 430 is performed through LDD implant mask 425, thereby forming the LDD regions 431-432 of low end transistor 312.

In general, the VDS breakdown voltage of a transistor can be separately or further controlled by selectively controlling the doping of LDD regions of the transistor. LDD regions having a relatively high doping concentration and a relatively shallow implant depth (i.e., a lower energy implant) will result in the corresponding transistor having a relatively low resistance, a relatively low threshold voltage and a relatively low VDS breakdown voltage. Conversely, LDD regions having a relatively low doping concentration and a relatively deep implant depth (i.e., a higher energy implant) will result in the corresponding transistor having a relatively high on-resistance, a relatively high threshold voltage and a relatively high VDS breakdown voltage. Thus, in accordance with one embodiment of the present invention, the high end transistor 311 is fabricated with LDD regions having a relatively low doping concentration and a relatively deep implant depth, and the low end transistor 312 is fabricated with LDD regions having a relatively high doping concentration and a relatively shallow implant depth.

Thus, in the example of FIG. 4C, the N-type LDD implant 430 performed through implant mask 425 to form the LDD regions 431-432 of low end transistor 312 is performed by implanting Arsenic at a relatively high dosage of about $1.0*10^{15}$ atoms per cm$^2$ (resulting in a doping profile of about $1.3*10^{19}$ atoms per cm$^3$) and a relatively low energy of about 5.0 KEV (to achieve a relatively shallow implant). The resulting LDD regions 431-432 cause the corresponding low end transistor 312 to have a relatively low VDS breakdown voltage (when compared to high end transistor 311).

Figure 4D:
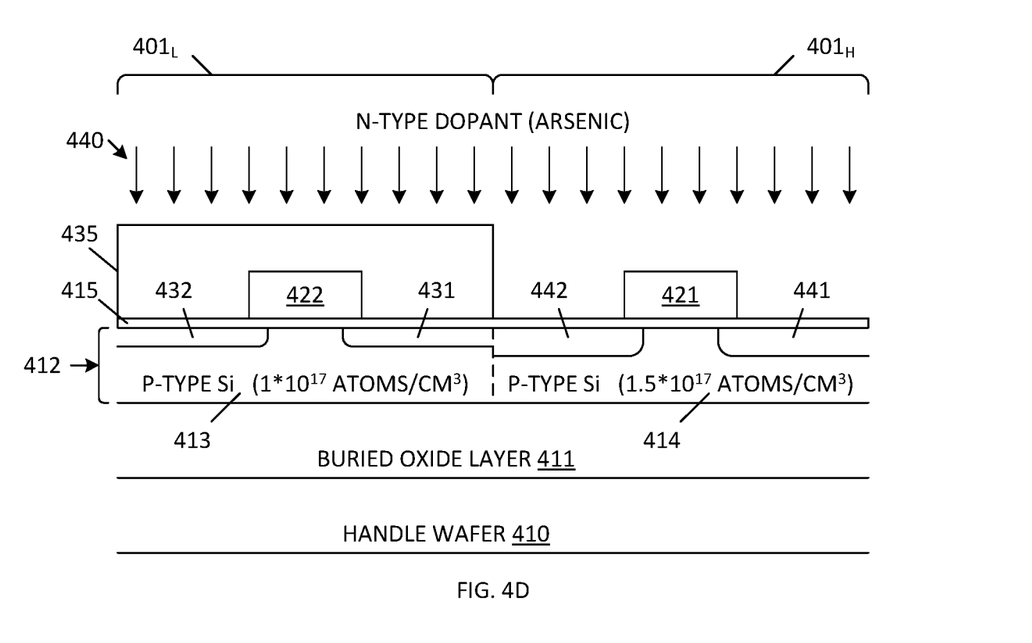

As illustrated by FIG. 4D, LDD implant mask 425 is stripped, and a second LDD implant mask 435 is formed over the resulting structure. More specifically, the second LDD implant mask 435 is formed over region $401_L$, wherein an opening in the second LDD implant mask 435 exposes region $401_H$. An N-type LDD implant 440 is performed through the second LDD implant mask 435, thereby forming the LDD regions 441-442 of high end transistor 311.

In the example of FIG. 4D, the N-type LDD implant 440 performed through implant mask 435 to form the LDD regions 441-442 of high end transistor 311 is performed by implanting Arsenic at a relatively low dosage of about $4.0*10^{14}$ atoms per cm$^2$ (resulting in a doping profile of about $5.0*10^{18}$ atoms per cm$^3$) and a relatively high energy of about 20.0 KEV (to achieve a relatively deep implant). The resulting LDD regions 441-442 cause the corresponding high end transistor 311 to have a relatively high VDS breakdown voltage (when compared to low end transistor 312).

Although the formation of LDD regions 431-432 is described as occurring before the formation of LDD regions 441-442, it is understood that the order of forming these LDD regions can be reversed in other embodiments.

Figure 4E:
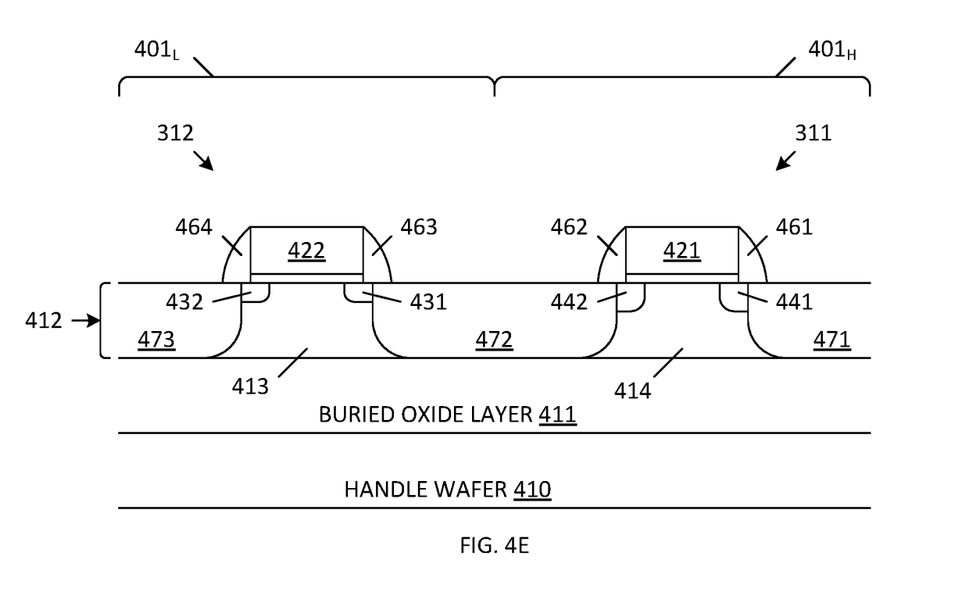

As illustrated in FIG. 4E, the second LDD implant mask 435 is stripped, and fabrication of the transistors 311-312 is completed by forming conventional structures including dielectric sidewall spacers 461-464 and N-type source/drain regions 471-473.

FIGS. 5A-5E are cross sectional views of the high end transistor 311 and the low end transistor 312 during various phases of fabrication in accordance with an alternate embodiment of the present invention. Similar elements in FIGS. 4A-4E and 5A-5E are labeled with similar reference numbers.

Figure 5A:
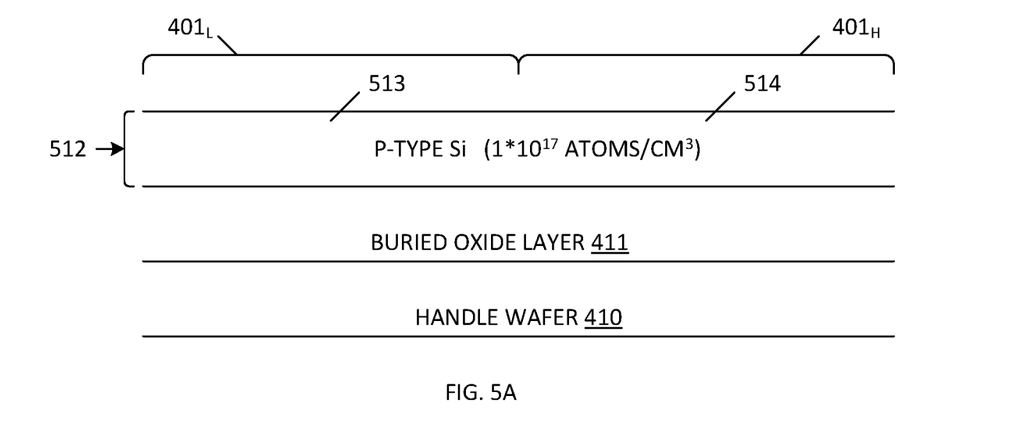
FIGS. 5A, 5B, 5C, 5D and 5E are cross-sectional views of a high end transistor and a low end transistor of the RF switch of FIG. 3 during various phases of fabrication in accordance with another embodiment of the present invention.

FIG. 5A illustrates a silicon layer 512 in which the transistors 311-312 are fabricated. Silicon layer 512 is doped, for example, to a concentration of about $1.0*10^{17}$ atoms per cm$^3$, using a P-type dopant such as Boron. In this embodiment, both the body region 513 of low end transistor 312 and the body region 514 of high end transistor 311 initially have the same body dopant concentration (about $1.0*10^{17}$ atoms per $cm^3$).

Figure 5B:
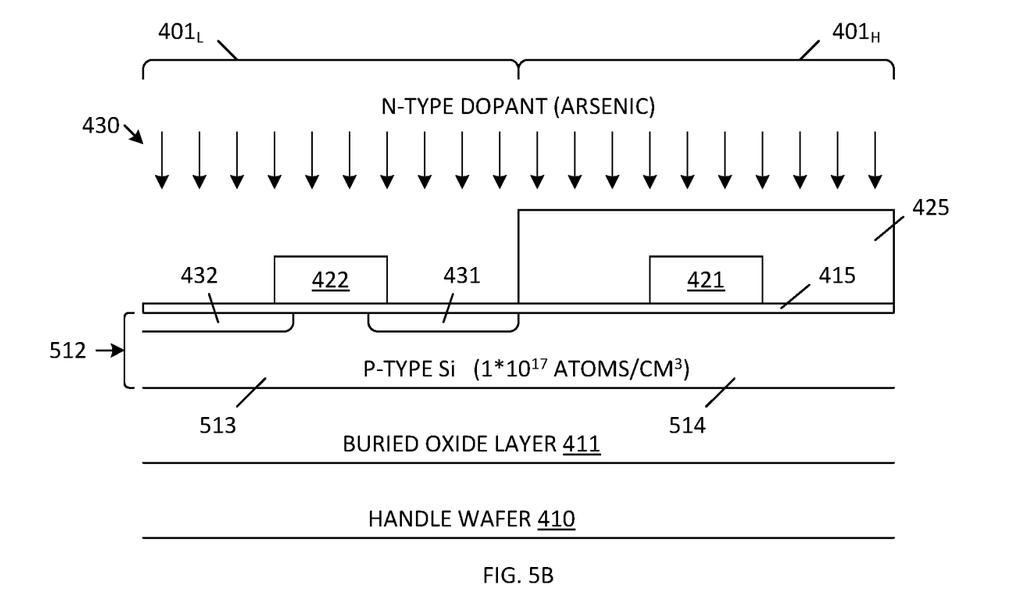

As illustrated by FIG. 5B, gate dielectric layer 420 is formed over the upper surface of silicon layer 512. Polysilicon gate electrodes 421 and 422 (of transistors 311 and 312, respectively) are formed over gate dielectric layer 420 in the manner described above in connection with FIG. 4C. The first lightly doped drain (LDD) implant mask 425 is formed over region 401H, and an N-type LDD implant 430 is performed through LDD implant mask 425, in the manner described above in connection with FIG. 4C. As a result, LDD regions 431-432 of low end transistor 312 are formed in silicon layer 512, wherein these LDD regions 431-432 have a doping profile of about $1.3*10^{19}$ atoms per $cm^3$ (and a relatively shallow implant depth).

Figure 5C:
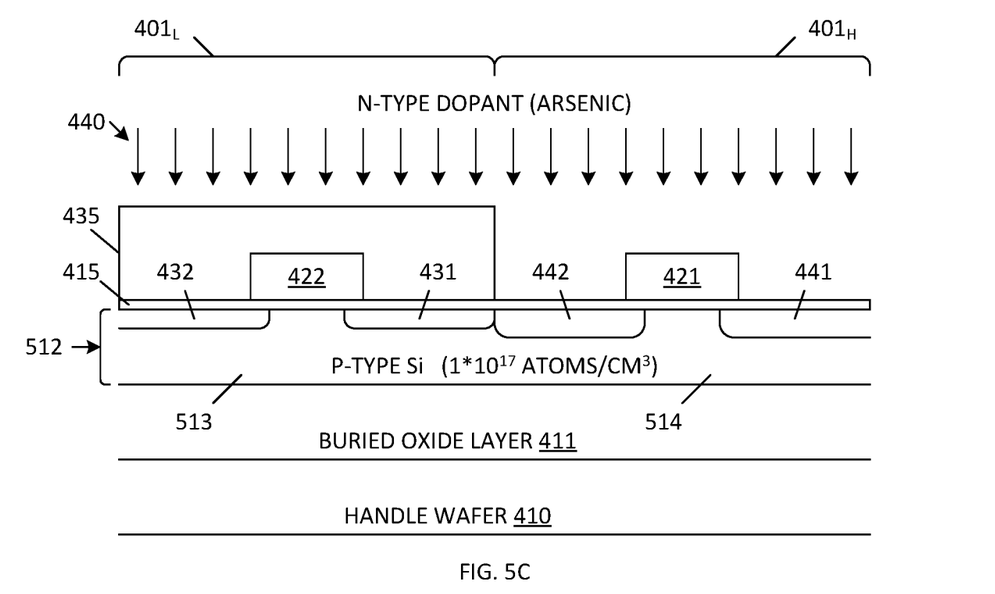

As illustrated by FIG. 5C, LDD implant mask 425 is stripped, and the second LDD implant mask 435 is formed over the resulting structure in the manner described above in connection with FIG. 4D. The N-type LDD implant 440 is performed through the second LDD implant mask 435 in the manner described above in connection with FIG. 4D, thereby forming the LDD regions 441-442 of high end transistor 311. As a result, LDD regions 441-442 of high end transistor 311 are formed in silicon layer 512, wherein these LDD regions 4341-442 have a doping profile of about $5.0*10^{18}$ atoms per $cm^3$ (and a relatively deep implant depth).

Figure 5D:
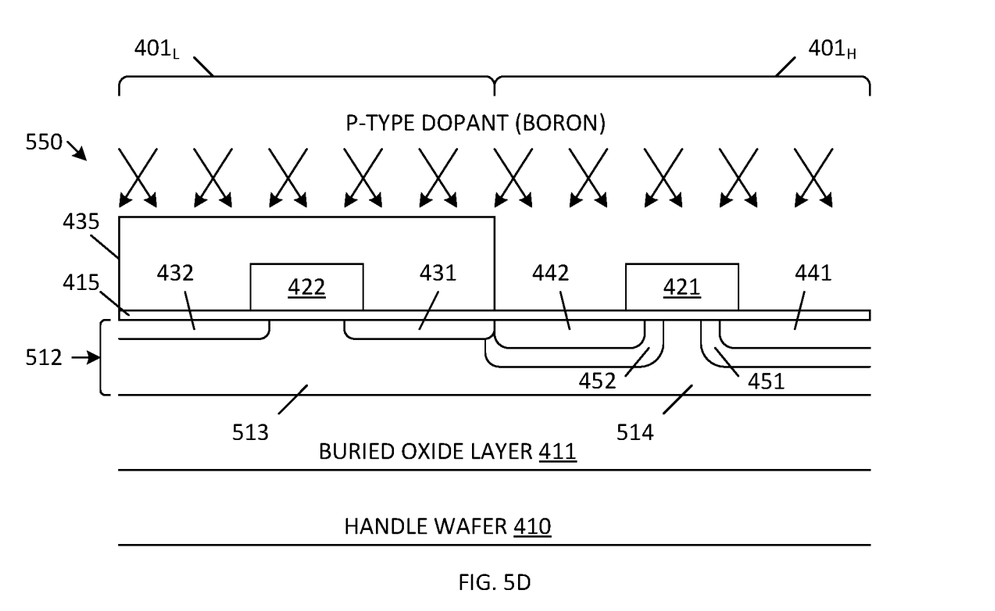

As illustrated in FIG. 5D, the second LDD implant mask 435 is also used as a halo implant mask, wherein the high end transistor 311 receives halo implants through the second LDD implant mask 435. As described in more detail below, the halo implants provide further control of the VDS breakdown voltages of the high end transistors of the RF switch branch 300. Advantageously, the halo implants are performed after the gate electrodes 421-422 have been defined, thereby allowing the halo implants to be precisely aligned with the gate electrodes 421-422. The halo implants have an opposite conductivity type as the LDD implants.

In the example of FIG. 5D, angled halo implants 550 are performed on both sides of the transistor (i.e., on the source side and the drain side). In the described example, the halo implants are performed by implanting Boron at an angle of about 30 degrees (from vertical), at an energy of about 30 KEV and a dose of about $5.0*10^{13}$ atoms per $cm^2$, resulting in halo regions 451-452 having a doping profile of about $1.5*10^{17}$ atoms per $cm^3$. The halo implants effectively change the doping of body region 514, increasing the on-resistance, VDS breakdown voltage and threshold voltage of the associated high end transistor 311.

Although the examples described above implement the LDD implant of the high end transistor 311 before the halo implant of the high end transistor 311, it is understood that the order of these implants can be reversed in other embodiments.

Figure 5E:
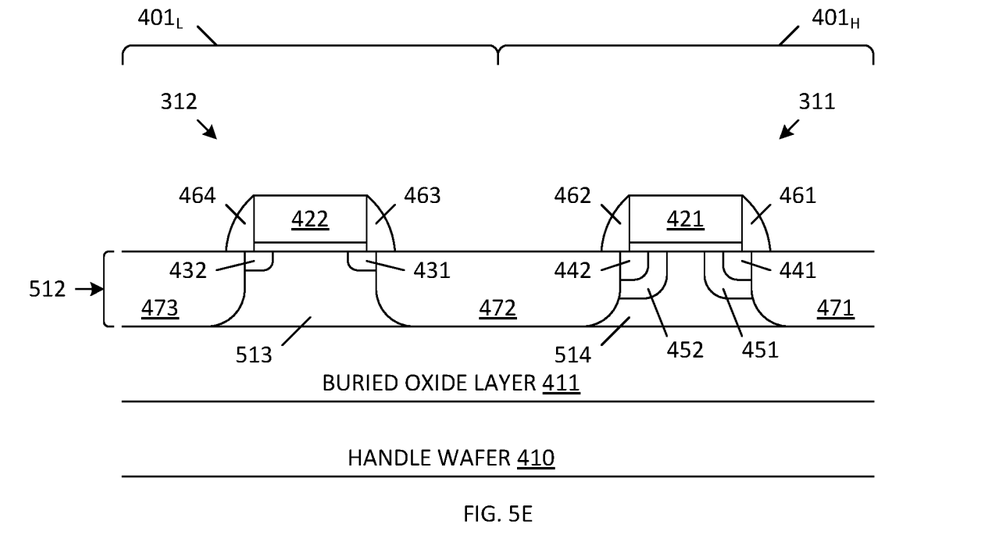

As illustrated in FIG. 5E, the second LDD implant mask 435 is stripped, and fabrication of the transistors 311-312 is completed by forming conventional structures including dielectric sidewall spacers 461-464 and N-type source/drain regions 471-473.

In the examples described above, the high end transistor 311 receives either the separate body implant 416 (FIGS. 4A-4E), or the halo implants 550 (FIGS. 5A-5E). Fabricating the high end transistor 311 using only the separate body implant 416 (and not the halo implants 550) advantageously results in a more uniform doping of the body region 414. Conversely, fabricating the high end transistor 311 using only the halo implants 550 (and not the separate body implant 416) advantageously eliminates the requirement for the additional mask 415 (note that an additional mask is not required for halo implants 550, as these implants use the same mask 435 as the LDD implants 450).

Figure 6:
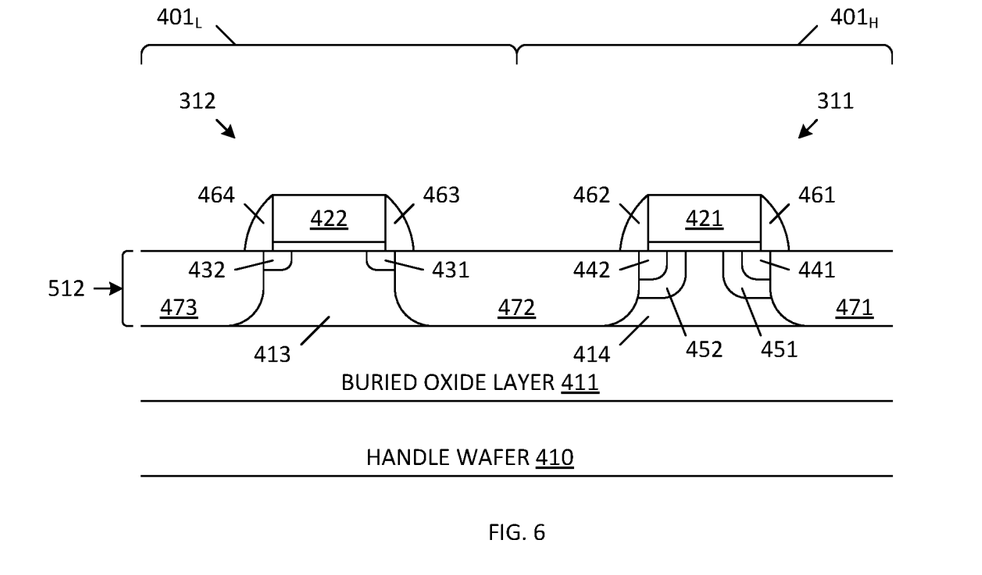
FIG. 6 is a cross-sectional view of a high end transistor and a low end transistor of the RF switch of FIG. 3 in accordance with yet another embodiment of the present invention.

In other embodiments, the high end transistor 311 may receive both of the separate body implant 416 and the halo implants 550. FIG. 6 is a cross sectional view of transistors 311-312 in accordance with an embodiment that includes the separate body implant 416 of FIG. 4B (which results in heavily doped body region 414), and the halo implants 550 of FIG. 5D (which result in halo regions 451-452).

The above-described methods of providing (1) a body doping differential, (2) an LDD doping differential, and (3) halo implant regions can each be used separately to form high end and low end transistors.

For example, method (1) can be used to fabricate a low end transistor having a lightly doped body region (like body region 413) and a high end transistor having a more heavily doped body region (like body region 414). In this embodiment, both the low end transistor and the high end transistor would have similar LDD regions (i.e., either LDD regions 431-432, or LDD regions 441-442), and neither the low end transistor nor the high end transistor would have halo implants.

Similarly, method (2) can be used to fabricate a low end transistor having LDD regions 431-432 and a high end transistor having LDD regions 441-442. In this embodiment, both the low end transistor and the high end transistor would have similarly doped body regions (i.e., either similar to body region 413 or body region 414), and neither the low end transistor nor the high end transistor would have halo implants.

Finally, method (3) can be used to fabricate a low end transistor that does not include halo implant regions, and a high end transistor that includes halo implant regions 451-452. In this embodiment, both the low end transistor and the high end transistor would have similar LDD regions (i.e., either LDD regions 431-432, or LDD regions 441-442), and both the low end transistor and the high end transistor would have similarly doped body regions (i.e., either similar to body region 413 or body region 414).

In other embodiments, any two of these methods (1), (2) and (3) can be combined to form high end and low end transistors. In yet another embodiment, combinations of all three of these methods (1), (2) and (3) can be used to form high end and low end transistors.

Figure 7:
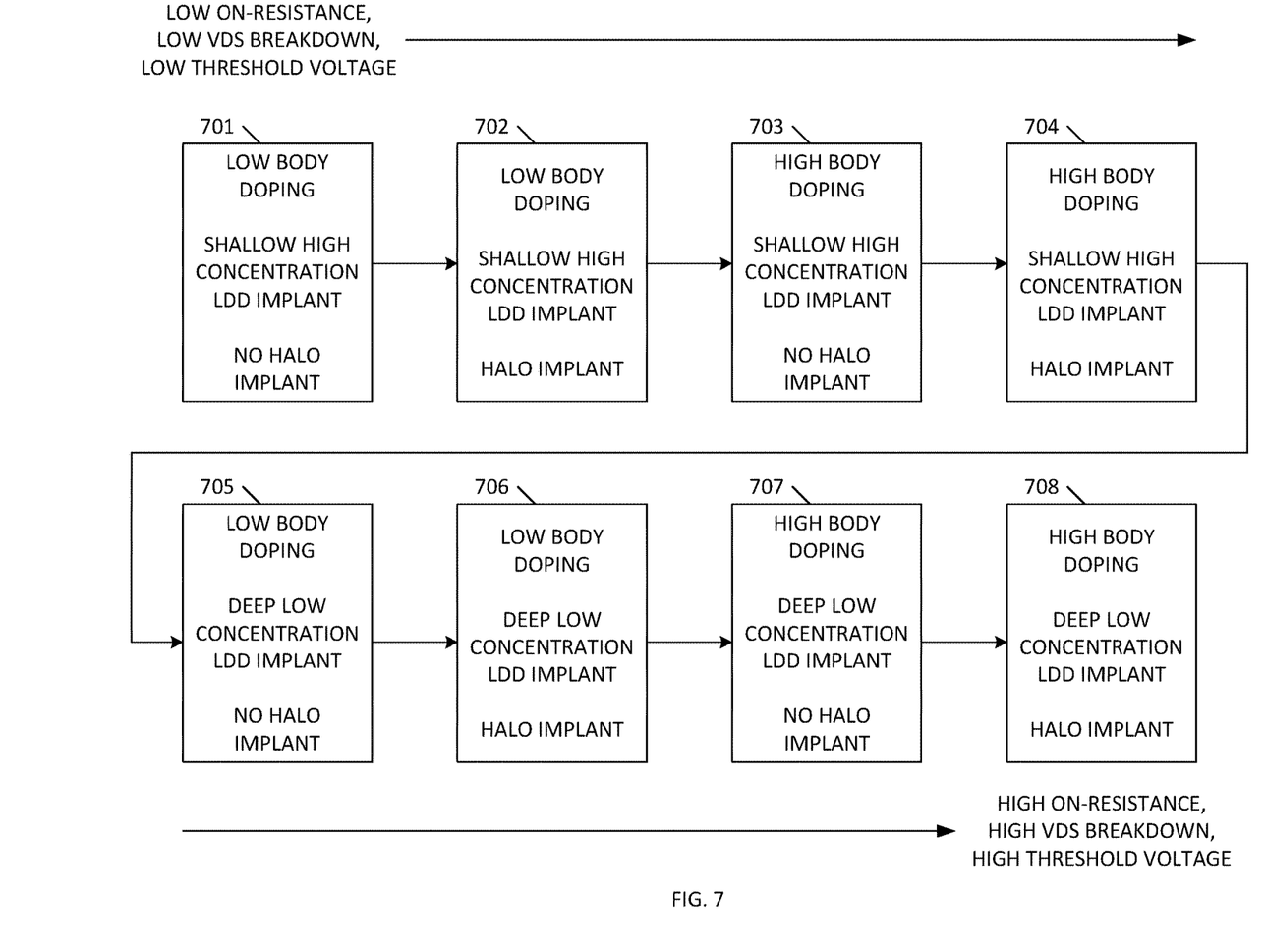
FIG. 7 is a block diagram illustrating eight possible transistor constructions using the methods of FIGS. 4A-4E and 5A-5E, ranked from the low on-resistance/VDS breakdown voltage/threshold voltage to high on-resistance/VDS breakdown voltage/threshold voltage.

FIG. 7 is a block diagram illustrating eight possible transistor constructions 701-708 using the above-described methods, which are ranked from the lowest on-resistance/VDS breakdown voltage/threshold voltage (transistor construction 701) to the highest on-resistance/VDS breakdown voltage/threshold voltage (transistor construction 708). In the embodiment of FIG. 7, it is assumed that the LDD implants 430 and 440 have the highest impact on the transistor characteristics, followed by the doping of body regions 413-414, and then the halo implants 450. Thus, a transistor having the transistor construction 701 will include body region 413 (low body doping) and LDD regions 431-432 (shallow, high concentration LDD implant), but will not include the halo implant regions 451-452 (no halo implant). A transistor having the transistor construction 708 will include body region 414 (high body doping), LDD regions 441-442 (deep, low concentration LDD implant), and halo implant regions 451-452 (halo implant). The hierarchy of transistor constructions 701-708 allow for up to eight different types of transistors to be connected in a single RF switch branch, thereby precisely optimizing the VDS breakdown voltages of the transistors in the RF switch branch. It is understood that, as a practical matter, the number of different types of transistors constructions used in an RF switch branch would be limited by the desire to reduce the number of masks/processing steps used to fabricate the RF switch branch. It is also understood that different hierarchies of transistor constructions could be realized by varying the characteristics (effects) of the body implants, LDD implants and halo implants.

One of the advantages of the present disclosure is to more precisely optimize the VDS breakdown voltage of transistors, and under more precise control, to achieve a more linear control over VDS breakdown voltage and on-resistance trade off. Although the present invention has been described in combination with the use of an RF switch branch, it is understood that the transistors of the present invention can also be used in other general applications.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure. The present invention is therefore intended to be limited only by the following claims.

We claim:

1. A switch comprising:
a plurality of field effect transistors connected in series between a first node and a second node, wherein the plurality of field effect transistors include:
a first transistor having a first body region having a first conductivity type, a first set of lightly doped drain (LDD) regions having a second conductivity type, opposite the first conductivity type, and a first set of halo implant regions of the first conductivity type located between the first set of LDD regions and the first body region, wherein the first set of halo implant regions have a dopant concentration greater than a dopant concentration of the first body region; and
a second transistor having a second body region having the first conductivity type, and a second set of LDD regions having the second conductivity type, wherein the second transistor does not include halo implant regions located between the second set of LDD regions and the second body region, and wherein the first transistor has a higher breakdown voltage than the second transistor.

2. The switch of claim 1, wherein the first set of LDD regions has a dopant concentration lower than a dopant concentration of the second set of LDD regions.

3. The switch of claim 2, wherein the first set of LDD regions extend a first depth into the first body region, and the second set of LDD regions extend a second depth into the second body region, wherein the first depth is greater than the second depth.

4. The switch of claim 1, wherein the first body region has a dopant concentration equal to a dopant concentration of the second body region.

5. The switch of claim 1, wherein the first and second body regions are located on a buried oxide layer.

6. The switch of claim 1, wherein the first node comprises a power amplifier output and the second node comprises an antenna input.

7. The switch of claim 1, wherein the first transistor has a first channel length and the second transistor has a second channel length, wherein the first channel length is the same as the second channel length.

8. A method of fabricating a switch including a first transistor and a second transistor coupled in series between a first node and a second node, the method comprising:
forming the first transistor in a first body region having a first conductivity type, wherein the first transistor includes a first set of lightly doped drain (LDD) regions having a second conductivity type,
forming the second transistor in a second body region having the first conductivity type, wherein the second transistor includes a second set of LDD regions having the second conductivity type; and
performing halo implants having the first conductivity type to the first transistor, but not the second transistor, wherein the halo implants result in the formation of a set of halo regions between the first set of LDD regions and the first body region.

9. The method of claim 8, further comprising:
performing a first implant to form the first set of LDD regions; and
performing a second implant to form the second set of LDD regions, wherein the first implant has a lower dosage than the second implant.

10. The method of claim 9, further comprising performing the first implant at a higher implant energy than the second implant.

11. The method of claim 8, wherein the first body region has a dopant concentration equal to a dopant concentration of the second body region.

12. The method of claim 8, wherein the first transistor has a first channel length and the second transistor has a second channel length, wherein the first channel length is the same as the second channel length.

* * * * *